US012696583B2

(12) United States Patent (10) Patent No.: US 12,696,583 B2
Liu et al. (45) Date of Patent: Jul. 28, 2026

(54) MICRO LIGHT EMITTING ELEMENT AND ITS PREPARATION METHOD

(71) Applicant: XIAMEN CHANGELIGHT CO., LTD., Xiamen (CN)

(72) Inventors: Wei Liu, Xiamen (CN); Weiwen Liu, Xiamen (CN); Shaowen Peng, Xiamen (CN); Fengjie Lin, Xiamen (CN); Hongyi Zhou, Xiamen (CN)

(73) Assignee: XIAMEN CHANGELIGHT CO., LTD., Xiamen (CN)

( * ) Notice: Subject to any disclaimer, the term of this patent is extended or adjusted under 35 U.S.C. 154(b) by 381 days.

(21) Appl. No.: 18/395,445

(22) Filed: Dec. 22, 2023

(65) Prior Publication Data

US 2024/0128403 A1 Apr. 18, 2024

Related U.S. Application Data

(63) Continuation of application No. PCT/CN2022/102752, filed on Jun. 30, 2022.

(30) Foreign Application Priority Data

Jul. 1, 2021 (CN) .......................... 202110740250.9

(51) Int. Cl.
*H10H 20/814* (2025.01)
*H10H 20/01* (2025.01)
(Continued)

(52) U.S. Cl.
CPC .... *H10H 20/814* (2025.01); *H10H 20/01335* (2025.01); *H10W 90/00* (2026.01); *H10H 20/825* (2025.01)

(58) Field of Classification Search
CPC ........... H10H 20/814; H10H 20/01335; H10H 20/825; H10H 20/841; H10H 20/8312;
(Continued)

(56) References Cited

U.S. PATENT DOCUMENTS 9,954,028 B2 * 4/2018 Yeon .................... H10H 29/142
2019/0273187 A1 9/2019 Yoon et al.

FOREIGN PATENT DOCUMENTS

CN 108172674 A 6/2018
CN 108878600 A 11/2018
(Continued)

OTHER PUBLICATIONS

International Search Report issued in Application No. PCT/CN2022/102752 dated Aug. 22, 2022 with English translation,(6p).
(Continued)

*Primary Examiner* — David Vu
(74) *Attorney, Agent, or Firm* — Arch & Lake LLP; Hao Tan; Shen Wang

(57) ABSTRACT

The present disclosure provides a micro light-emitting element, method for manufacturing a micro light-emitting element, and a light-emitting device. The micro light-emitting element includes a DBR structure layer, including a DBR adhesive layer, a DBR reflective layer, and a DBR sacrificial layer, where the DBR adhesive layer, the DBR reflective layer, and the DBR sacrificial layer are sequentially stacked. Subsequent structural coverage of a DBR reflective layer is improved by means of the DBR adhesion layer. Density of film layers of the DBR sacrificial layer, the DBR reflective layer, and the DBR adhesive layer are sequentially increased, so that etching rates of the DBR sacrificial layer, the DBR reflective layer, and the DBR adhesive layer are sequentially decreased during etching, thereby forming an inverted trapezoidal through hole which comprises an inclined side wall by an etching process.

14 Claims, 9 Drawing Sheets

(51) Int. Cl.
    *H10W 90/00*     (2026.01)
    *H10H 20/825*     (2025.01)

(58) Field of Classification Search
    CPC ........ H10H 20/01; H10H 20/83; H10H 20/84;
                                    H10W 90/00
    See application file for complete search history.

(56)                     References Cited

FOREIGN PATENT DOCUMENTS

| | | | |
|---|---|---|---|
| CN | 109326686 | A | 2/2019 |
| CN | 113054065 | A | 6/2021 |
| CN | 213520024 | U | 6/2021 |
| CN | 113451476 | A | 9/2021 |
| CN | 113875029 | A | 12/2021 |
| JP | 2016171340 | A | 9/2016 |

OTHER PUBLICATIONS

Written Opinion of the International Searching Authority In Application No. PCT/CN2022/102752 dated Sep. 7, 2022, (8p).

\* cited by examiner

A

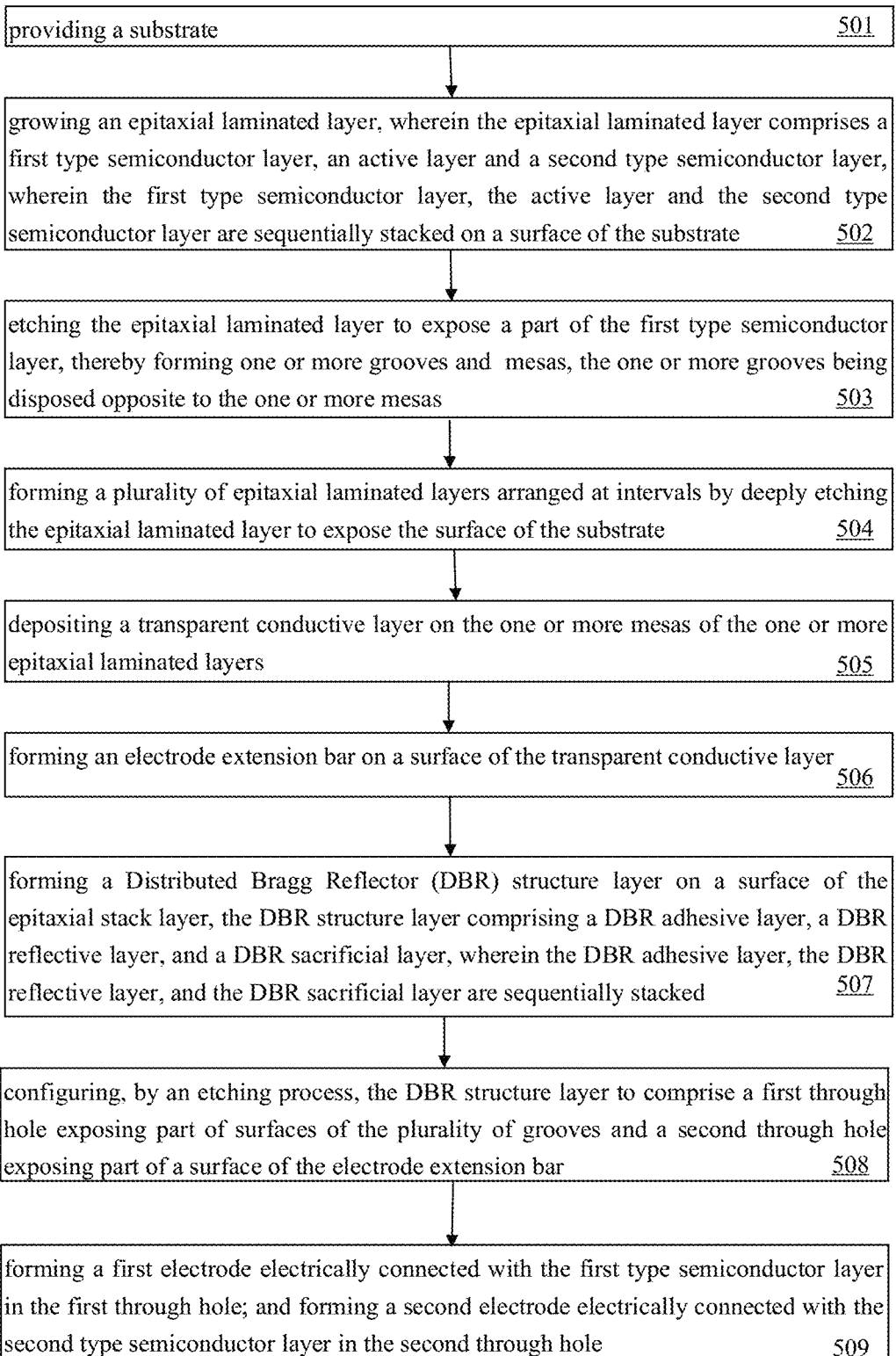

providing a substrate                                                          501 growing an epitaxial laminated layer, wherein the epitaxial laminated layer comprises a first type semiconductor layer, an active layer and a second type semiconductor layer, wherein the first type semiconductor layer, the active layer and the second type semiconductor layer are sequentially stacked on a surface of the substrate          502 etching the epitaxial laminated layer to expose a part of the first type semiconductor layer, thereby forming one or more grooves and  mesas, the one or more grooves being disposed opposite to the one or more mesas                                      503 forming a plurality of epitaxial laminated layers arranged at intervals by deeply etching the epitaxial laminated layer to expose the surface of the substrate          504 depositing a transparent conductive layer on the one or more mesas of the one or more epitaxial laminated layers                                                          505 forming an electrode extension bar on a surface of the transparent conductive layer
                                                                              506 forming a Distributed Bragg Reflector (DBR) structure layer on a surface of the epitaxial stack layer, the DBR structure layer comprising a DBR adhesive layer, a DBR reflective layer, and a DBR sacrificial layer, wherein the DBR adhesive layer, the DBR reflective layer, and the DBR sacrificial layer are sequentially stacked          507 configuring, by an etching process, the DBR structure layer to comprise a first through hole exposing part of surfaces of the plurality of grooves and a second through hole exposing part of a surface of the electrode extension bar                        508 forming a first electrode electrically connected with the first type semiconductor layer in the first through hole; and forming a second electrode electrically connected with the second type semiconductor layer in the second through hole          509

Figure 5

MICRO LIGHT EMITTING ELEMENT AND ITS PREPARATION METHOD

CROSS-REFERENCE TO RELATED DISCLOSURES

This application is a continuation of PCT application PCT/CN2022/102752, filed on Jun. 30, 2022, which is based on and claims priority to Chinese patent application 202110740250.9, filed on Jul. 1, 2021, and titled "A Micro Light Emitting Element and Its Preparation Method," the entire disclosures of which are incorporated herein by reference for all purposes.

TECHNICAL FIELD

This disclosure relates to the field of semiconductor devices such as light-emitting diodes (LEDs), particularly to a micro light emitting element and its preparation method.

BACKGROUND TECHNOLOGY

With the continuous development of semiconductor light-emitting technology, the application of LEDs is rapidly evolving, especially in the development of display technology. Meanwhile, due to the need for high resolution in LED displays, the pitch and size of LED chips are becoming smaller, such as Mini-LEDs. However, small-sized LED chips face the technical challenge of low light-emitting efficiency.

Currently, the industry mostly commonly uses an Indium Tin Oxide (ITO)+electrode extension bar+Distributed Bragg Reflector (DBR) flip-chip structure, as shown in FIGS. 1 and 2, where the light emitted from the active layer needs to be reflected by a high-quality mirror of the DBR to improve light output. The DBR, as a light-reflective layer, is fabricated using high-temperature vapor deposition, and the DBR reflective layer is a TI3O5/SiO2 multilayer optical design structure. However, due to the lack of uniform film thickness on the non-planar surface of the inverted DBR reflective layer obtained by conventional processes, especially poor step coverage, the reflection of light by the DBR reflective layer is limited, affecting subsequent electrode coverage and leading to metal fracture in the electrode, impacting the reliability of LED chips, among other issues. Secondly, the presence of electrode extension bars causes a significant height difference between the DBR reflective layer above the electrode extension bars and that above the ITO, leading to a height difference in subsequent electrode vapor deposition. This makes the electrode above the flip-chip electrode extension bars a point of stress, posing a risk of electrode detachment. Lastly, as shown at point A in FIG. 2, when the DBR layer is etched with Inductively Coupled Plasma (ICP) dry etching to form through-holes for carrying the electrodes, the anisotropic etching of ICP makes the DBR etching angle steep and not conducive to subsequent electrode coverage, easily leading to metal fracture in the electrode and severely affecting chip reliability.

In view of this, this disclosure provides a micro light emitting element and its preparation method.

SUMMARY

The present disclosure provides a micro light-emitting element and its preparation method, to ensure luminous efficiency of the micro light-emitting element while solving the problems caused by limited light reflection due to poor step coverage of a DBR reflective layer, and the subsequent issues it creates for electrode coverage.

For the purpose above, the present disclosure adopts following technical solutions.

According to a first aspect of the present disclosure, a micro light-emitting element, including a substrate and one or more light-emitting diode (LED) array units arranged on a surface of the substrate and isolated from each other by grooves is provided. The one or more LED array units include: an epitaxial laminated layer, an electrode extension bar stacked on the mesa, a Distributed Bragg Reflector (DBR) structure layer, a first electrode, and a second electrode.

The epitaxial laminated layer includes a first type semiconductor layer, an active layer, and a second type semiconductor layer, where the first type semiconductor layer, the active layer, and the second type semiconductor layer are sequentially stacked in a first direction; a local area of the epitaxial laminated layer is etched to a part of the first type semiconductor layer resulting in a groove and a mesa; and the first direction is perpendicular to the substrate, and points from the substrate to the epitaxial laminated layer. The Distributed Bragg Reflector (DBR) structure layer may include a DBR adhesive layer, a DBR reflective layer, and a DBR sacrificial layer, where the DBR adhesive layer, the DBR reflective layer, and the DBR sacrificial layer are sequentially stacked along a surface of the epitaxial laminated layer; where the DBR structure layer further includes a first through hole exposing part of a surface of the groove and a second through hole exposing part of a surface of the electrode extension bar.

The first electrode is stacked on the first through hole and electrically connected to the first type semiconductor layer. The second electrode is stacked on the second through hole and electrically connected to the second type semiconductor layer.

According to a second aspect of the present disclosure, a method is provided for manufacturing a micro light-emitting element. The method includes at least following steps:

providing a substrate;

growing an epitaxial laminated layer, where the epitaxial laminated layer includes a first type semiconductor layer, an active layer and a second type semiconductor layer, where the first type semiconductor layer, the active layer and the second type semiconductor layer are sequentially stacked on a surface of the substrate;

etching the epitaxial laminated layer to expose a part of the first type semiconductor layer, thereby forming one or more grooves and one or more mesas, the one or more grooves being disposed opposite to the one or more mesas;

forming one or more epitaxial laminated layers arranged at intervals by deeply etching the epitaxial laminated layer to expose the surface of the substrate;

depositing a transparent conductive layer on the one or more mesas of the one or more epitaxial laminated layers;

forming an electrode extension bar on a surface of the transparent conductive layer;

forming a Distributed Bragg Reflector (DBR) structure layer on a surface of the epitaxial stack layer, the DBR structure layer including a DBR adhesive layer, a DBR reflective layer, and a DBR sacrificial layer, wherein the DBR adhesive layer, the DBR reflective layer, and the DBR sacrificial layer are sequentially stacked;

configuring, through an etching process, the DBR structure layer to include a first through hole exposing part of surfaces of the one or more grooves and a second through hole exposing part of a surface of the electrode extension bar; and forming a first electrode electrically connected with the first type semiconductor layer in the first through hole; and forming a second electrode electrically connected with the second type semiconductor layer in the second through hole.

According to a third aspect of the present disclosure, a light-emitting device is provided. The light-emitting device includes: a driving device, configured to transmit a driving signal to one or more micro light-emitting elements; and the one or more micro light-emitting elements.

Each of the one or more micro-lighting elements includes: a substrate and one or more light-emitting diode (LED) array units arranged on a surface of the substrate and isolated from each other by grooves.

The one or more LED array units include: an epitaxial laminated layer, including a first type semiconductor layer, an active layer, and a second type semiconductor layer. The first type semiconductor layer, the active layer, and the second type semiconductor layer are sequentially stacked in a first direction. A local area of the epitaxial laminated layer is etched to a part of the first type semiconductor layer resulting in a groove and a mesa. The first direction is perpendicular to the substrate, and points from the substrate to the epitaxial laminated layer.

The one or more LED array units may further include: an electrode extension bar stacked on the mesa; a Distributed Bragg Reflector (DBR) structure layer, including a DBR adhesive layer, a DBR reflective layer, and a DBR sacrificial layer, where the DBR adhesive layer, the DBR reflective layer, and the DBR sacrificial layer are sequentially stacked along a surface of the epitaxial laminated layer; where the DBR structure layer further includes a first through hole exposing part of a surface of the groove and a second through hole exposing part of a surface of the electrode extension bar; a first electrode stacked on the first through hole and electrically connected to the first type semiconductor layer; and a second electrode stacked on the second through hole and electrically connected to the second type semiconductor layer.

BRIEF DESCRIPTION OF THE DRAWINGS

To clarify the technical solutions of the disclosure more clearly, the following provides a brief introduction to the figures used to illustrate the examples of this disclosure. Figures described below are examples of the present disclosure. For those of ordinary skill in the art, other drawings can be obtained based on these illustrations without creative effort.

FIG. 5 is a flow chart illustrating a method for manufacturing a micro light-emitting element corresponding to FIGS. 4A-4I.

DETAILED DESCRIPTION

Hereinafter, aspects of the present disclosure will be described in conjunction with the accompanying drawings, rather than to limit the present disclosure. Variations of structure, method, or functional made by the ordinary skilled in the art based on these examples are all contained in the scope of the present disclosure.

The terms used in present disclosure are merely directed to illustrate the particular examples, rather than limit to the present disclosure. The singular forms "a" "an" and "the" as used in the present disclosure as well as the appended claims also refer to plural forms unless other meanings are definitely contained in the context. It should be appreciated that the term "and/or" as used herein refers to any or all possible combination of one or more associated listed items.

The following examples describe the disclosure in further details in conjunction with examples and Figures. In the case of no conflict, the following examples and the features in the examples may be combined with each other. It should be understood that examples described in this specification are merely for explaining this disclosure and are not intended to limit this disclosure. For those of ordinary skill in the art, other examples can be obtained based on examples in this disclosure without creative effort; such other examples fall within the scope of protection of this disclosure.

Figure 1:
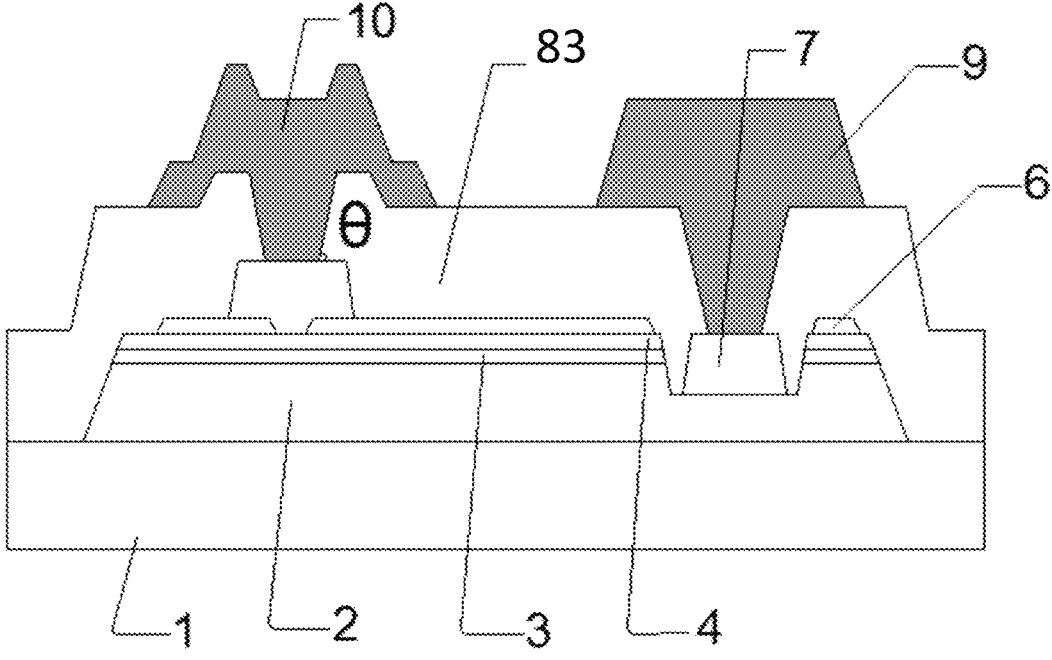
FIG. 1 shows a diagram of a structure of a small-sized LED chip in the prior art.

FIG. 1 shows a diagram of a structure of a small-sized LED chip in the prior art.

Figure 2:
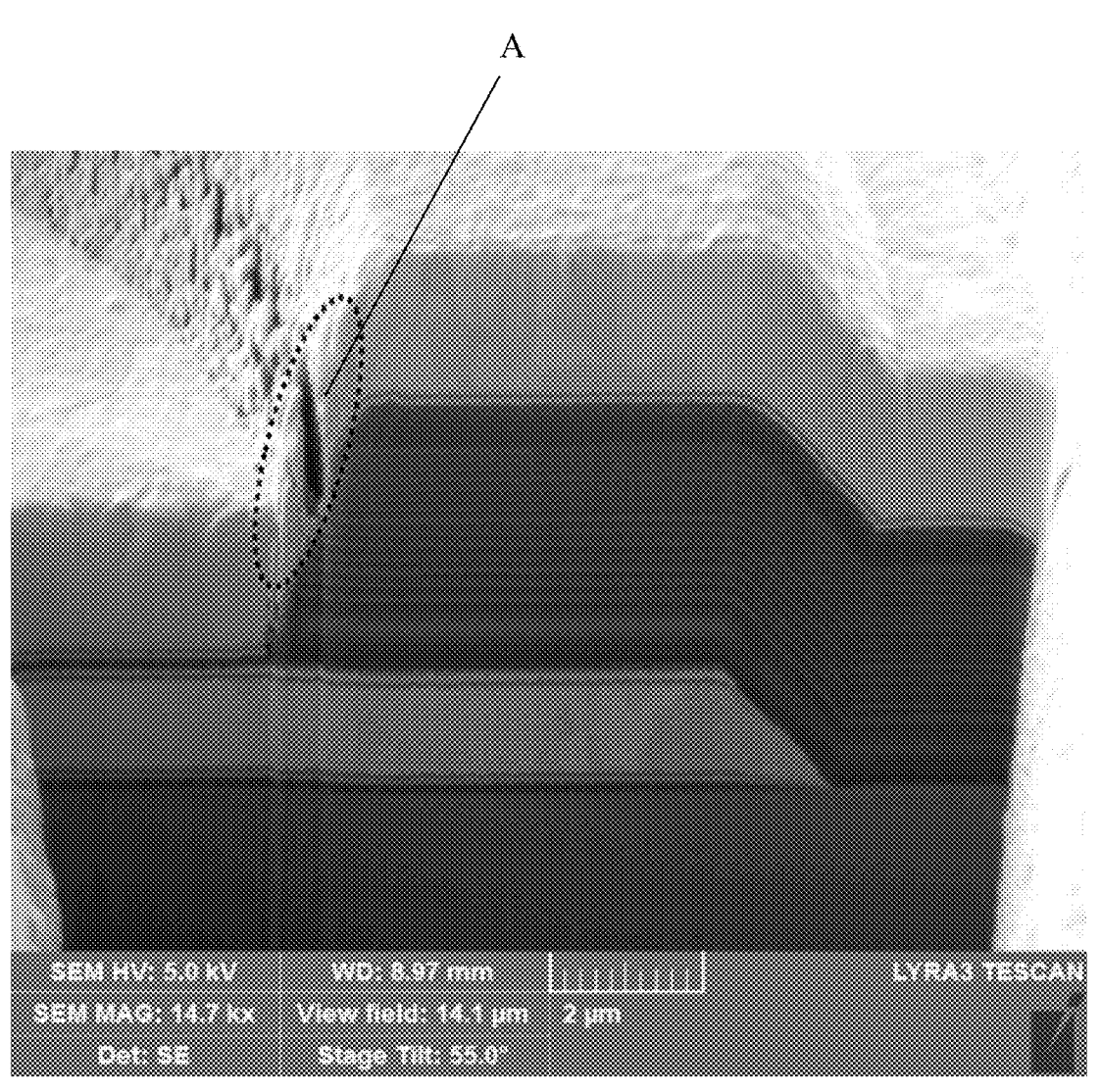
FIG. 2 shows a product rendering image illustrating through holes used to deposit electrodes corresponding to FIG. 1.

FIG. 2 shows a product rendering image illustrating through holes used to deposit electrodes corresponding to FIG. 1.

A first aspect of this disclosure provides a micro light-emitting element, including a substrate and one or more light-emitting diode (LED) array units arranged on a surface of the substrate and isolated from each other by grooves. The one or more LED array units include: an epitaxial laminated layer, an electrode extension bar stacked on the mesa, a Distributed Bragg Reflector (DBR) structure layer, a first electrode, and a second electrode.

The epitaxial laminated layer includes a first type semiconductor layer, an active layer, and a second type semiconductor layer, where the first type semiconductor layer, the active layer, and the second type semiconductor layer are sequentially stacked in a first direction; a local area of the epitaxial laminated layer is etched to a part of the first type semiconductor layer resulting in a groove and a mesa; and the first direction is perpendicular to the substrate, and points from the substrate to the epitaxial laminated layer. The Distributed Bragg Reflector (DBR) structure layer may include a DBR adhesive layer, a DBR reflective layer, and a DBR sacrificial layer, where the DBR adhesive layer, the DBR reflective layer, and the DBR sacrificial layer are sequentially stacked along a surface of the epitaxial laminated layer; where the DBR structure layer further includes a first through hole exposing part of a surface of the groove and a second through hole exposing part of a surface of the electrode extension bar.

The first electrode is stacked on the first through hole and electrically connected to the first type semiconductor layer. The second electrode is stacked on the second through hole and electrically connected to the second type semiconductor layer.

Figure 3:
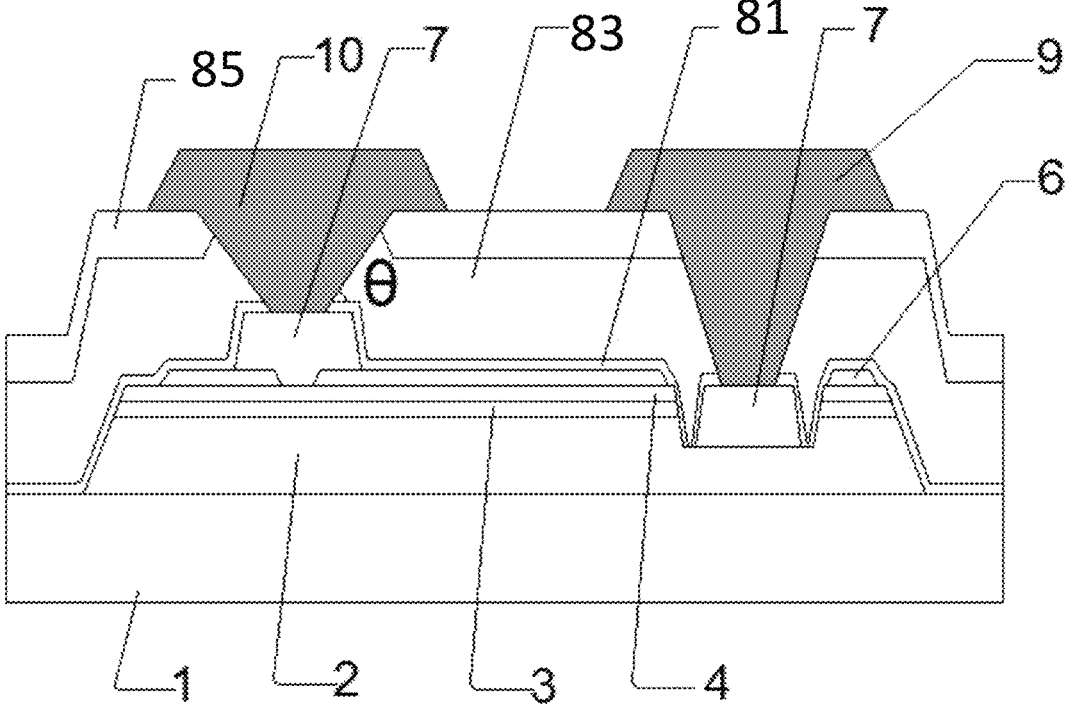
FIG. 3 shows an example diagram of a structure of a micro light-emitting element in accordance with one or more examples of the present disclosure.

FIG. 3 illustrates a micro light-emitting element in accordance with the first aspect of this disclosure, including a substrate 1 and one or more light-emitting diode (LED) array units arranged on the surface of the substrate and isolated from each other by grooves, where the one or more LED array units include:

an epitaxial laminated layer, including a first type semiconductor layer 2, an active layer 3, and a second type semiconductor layer 4, where the first type semiconductor layer 2, the active layer 3, and the second type semiconductor layer 4 are sequentially stacked in a first direction; a local area of the epitaxial laminated layer is etched to a part of the first type semiconductor layer 2 to form a groove 51 and a mesa 53; and the first direction is perpendicular to the substrate 1, and points from the substrate 1 to the epitaxial laminated layer;

an electrode extension bar 7 stacked on the mesa 53;

a Distributed Bragg Reflector (DBR) structure layer, including a DBR adhesive layer 81, a DBR reflective layer 83, and a DBR sacrificial layer 85, where the DBR adhesive layer 81, the DBR reflective layer 83, and the DBR sacrificial layer 85 are sequentially stacked along a surface of the epitaxial laminated layer; where the DBR structure layer further includes a first through hole exposing part of a surface of the groove 51 and a second through hole exposing part of a surface of the electrode extension bar 7;

a first electrode 9 stacked on the first through hole and electrically connected to the first type semiconductor layer 2, the first through hole exposing part of a surface of the groove 51; and a second electrode 10 stacked on the second through hole and electrically connected to the second type semiconductor layer 4, the second through hole exposing part of a surface of the electrode extension bar 7.

In examples of this disclosure, a type of the substrate 1 is not limited. In some examples, the substrate 1 may be, but is not limited to, a sapphire substrate 1, a silicon substrate 1, and so on. Further, in examples of this disclosure, types of the first type semiconductor layer 2, the active layer 3, and the second type semiconductor layer 4 are not limited. In some examples, the first type semiconductor layer 2 may be, but is not limited to, a gallium nitride layer. Correspondingly, in some examples, the second type semiconductor layer 4 may be, but is not limited to, a gallium nitride layer.

In some examples of the disclosure, an electrode extension bar 7 disposed on the mesa 53 may be directly electrically connected to the second type semiconductor layer 4 through the second through hole, the second through hole exposing part of a surface of the electrode extension bar 7. This enables the electrode extension bar 7 to directly electrically connect with the second type semiconductor layer 4. Thereby, in the LED array units, a current of the second electrode 10 flows directly into the epitaxial laminated layer, which is beneficial for practical operation. In other examples of this disclosure, the electrode extension bar 7 may also be stacked on a surface of a transparent conductive layer 6, depending on specific circumstances, without limitation imposed by this disclosure.

In some examples, density of film layers of the DBR sacrificial layer 85, the DBR reflective layer 83, and the DBR adhesive layer 81 are sequentially increased, so that etching rates of the DBR sacrificial layer 85, the DBR reflective layer 83, and the DBR adhesive layer 81 are sequentially decreased during etching, thereby forming an inverted trapezoidal through hole which includes an inclined side wall by an etching process.

In some examples, an included angle is formed between the inclined side wall and a horizontal surface of the epitaxial laminated layer, and a value $\theta$ of the included angle is in a range of 5°-50°, inclusive of endpoint values.

In some examples, a ratio of a thickness of the DBR reflective layer 83 to a thickness of the DBR sacrificial layer 85 is in a range of 1:1 to 1:5; and the thickness of the DBR sacrificial layer 85 increases as the included angle decreases. This disclosure does not limit specific values of thickness of the DBR reflective layer 83 and thickness of the DBR sacrificial layer 85, as long as the ratio of the thickness of the DBR reflective layer 83 to the thickness of the DBR sacrificial layer 85 satisfies the requirements above and a relation of the thickness of the DBR sacrificial layer 85 and the included angle satisfies the requirements above. Specific thickness values are determined according to circumstances.

In some examples, the mesa 53 further includes a transparent conductive layer 6, and the electrode extension bar 7 is stacked on a side surface of the transparent conductive layer 6 facing away from the epitaxial stack layer.

In some examples, the electrode extension bar 7 may include an electrode extension bar 7 formed or disposed on the mesa 53 and/or an electrode extension bar 7 formed or disposed in the groove 51. The electrode extension bar 7 disposed on the mesa 53 may function as an extension of the second electrode 10 on the mesa 53; the electrode extension bar 7 disposed in the groove 51 may function as an extension of the first electrode 9 on the groove 51. A quantity of the electrode extension bar 7 may be one or multiple. Specific quantity of the electrode extension bar 7 is determined according to circumstances, and is not limited in this disclosure.

In some examples, a material of the transparent conductive layer 6 may be Indium Tin Oxide (ITO). Specific material of the transparent conductive layer 6 is determined according to circumstances, and is not limited in this disclosure.

In some examples, the DBR adhesive layer 81 is obtained by atomic layer deposition, and includes at least one of $Ti_3O_5$, $SiO_2$, or $Al_2O_3$, or any combination thereof. Specific manufacturing process of the DBR adhesive layer 81 and for example materials of the DBR adhesive layer 81 are determined according to circumstances, and are not limited in this disclosure.

In some examples, the DBR reflective layer 83 includes a plurality of film layers with alternating high and low refractive rate, where thickness of each film layer is one-fourth of a wavelength of light emitted by the micro light-emitting element.

In some examples, the DBR sacrificial layer 85 includes a spin-coated glass layer or an insulating film obtained by low-temperature deposition. Specific manufacturing process of the spin-coated glass layer or the insulating film is determined according to circumstances, and is not limited in this disclosure.

In some examples, the electrode extension bar 7 includes at least one of Cr, Ni, Al, Ti, Pt, or Au, or any combination thereof. Specific composition of the electrode extension bar 7 is determined according to circumstances, and is not limited in this disclosure.

A second aspect of this disclosure provides a method for manufacturing a micro light-emitting element, including at least following steps:

providing a substrate;

growing an epitaxial laminated layer, where the epitaxial laminated layer includes a first type semiconductor layer, an active layer and a second type semiconductor layer, where the first type semiconductor layer, the active layer and the second type semiconductor layer are sequentially stacked on a surface of the substrate;

etching the epitaxial laminated layer to expose a part of the first type semiconductor layer, thereby forming one or more grooves and one or more mesas, the one or more grooves being disposed opposite to the one or more mesas;

forming one or more epitaxial laminated layers arranged at intervals by deeply etching the epitaxial laminated layer to expose the surface of the substrate;

depositing a transparent conductive layer on the one or more mesas of the one or more epitaxial laminated layers;

forming an electrode extension bar on a surface of the transparent conductive layer;

forming a Distributed Bragg Reflector (DBR) structure layer on a surface of the epitaxial stack layer, the DBR structure layer including a DBR adhesive layer, a DBR reflective layer, and a DBR sacrificial layer, where the DBR adhesive layer, the DBR reflective layer, and the DBR sacrificial layer are sequentially stacked;

configuring, through an etching process, the DBR structure layer to include a first through hole exposing part of surfaces of the one or more grooves and a second through hole exposing part of a surface of the electrode extension bar; and forming a first electrode electrically connected with the first type semiconductor layer in the first through hole;

and forming a second electrode electrically connected with the second type semiconductor layer in the second through hole.

FIG. 5 is a flowchart illustrating a method for manufacturing a micro light-emitting element corresponding to FIGS. 4A-4I and in accordance with the second aspect of this disclosure. Structures of products of different steps of the method are illustrated respectively in FIGS. 4A-4I.

Figure 4A:
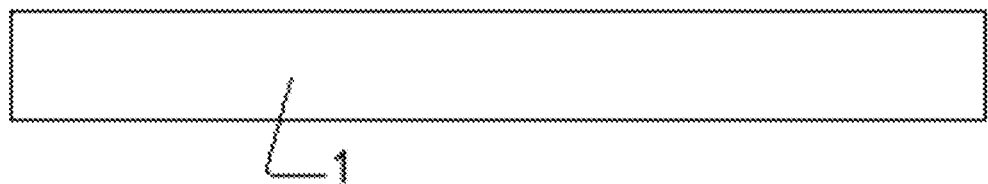
FIG. 4A is an example diagram of structures of a substrate provided in a first step of a method for manufacturing a micro light-emitting element in accordance with one or more examples of the present disclosure.

In Step 501, a manufacturer provides a substrate 1. Structures of the substrate 1 provided in Step 501 are illustrated in FIG. 4A.

In examples of this disclosure, a type of the substrate 1 is not limited. In some examples, the substrate 1 may include, but is not limited to, a sapphire substrate 1, a silicon substrate 1, and so on.

Figure 4B:
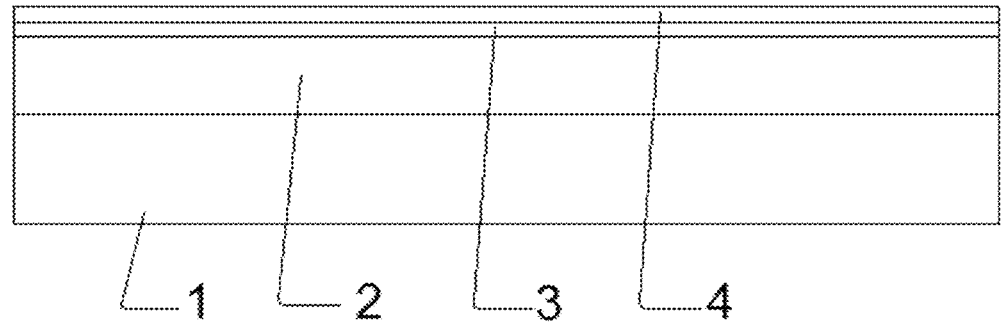
FIG. 4B is an example diagram of structures including an epitaxial laminated layer corresponding to a single LED array provided in a second step of the method in accordance with one or more examples of the present disclosure.

In Step 502, the manufacturer grows an epitaxial laminated layer, where the epitaxial laminated layer includes a first type semiconductor layer 2, an active layer 3, and a second type semiconductor layer 4, where the first type semiconductor layer 2, the active layer 3, and the second type semiconductor layer 4 are sequentially stacked on a surface of the substrate 1. Structures including the epitaxial laminated layer provided in Step 502 are illustrated in FIG. 4B.

In examples of this disclosure, types of the first type semiconductor layer 2, the active layer 3, and the second type semiconductor layer 4 are not limited. In some examples, the first type semiconductor layer 2 may be, but is not limited to, a gallium nitride layer. Correspondingly, in some examples, the second type semiconductor layer 4 may be, but is not limited to, a gallium nitride layer.

Figure 4C:
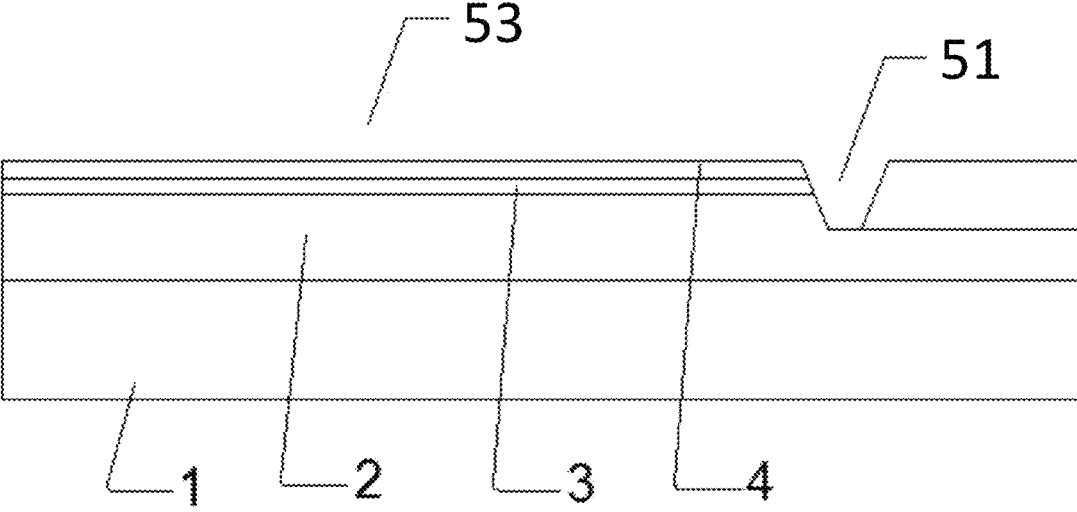
FIG. 4C is an example diagram of structures including the epitaxial laminated layer corresponding to the single LED array unit provided in a third step of the method in accordance with one or more examples of the present disclosure.

In Step 503, the manufacturer etches the epitaxial laminated layer to expose a part of the first type semiconductor layer 2, thereby forming one or more grooves 51 and one or more mesas 53, the one or more grooves 51 being disposed opposite to the one or more mesas 53. Structures including the epitaxial laminated layer corresponding to a single LED array unit provided in Step 503 are illustrated in FIG. 4C.

In some examples, the one or more grooves 51 formed in Step 503 of the method of the second aspect correspond to the groove 51 in the first aspect of the disclosure. In some examples, the groove 51 in the first aspect of the disclosure corresponds to the one or more grooves 51 formed in Step 503 of the method of the second aspect.

In some examples, the one or more mesas 53 formed in Step 503 of the method of the second aspect correspond to the mesa 53 in the first aspect of the disclosure. In some examples, the mesa 53 in the first aspect of the disclosure corresponds to the one or more mesas 53 formed in Step 503 of the method of the second aspect.

In some examples, forming the epitaxial laminated layer to expose a part of the first type semiconductor layer 2, thereby forming one or more grooves 51 and a mesa 53 includes: using multi-segment Inductively Coupled Plasma (ICP) etching, where an etching gas includes at least one of $Cl_2$, Ar, or $O_2$. This disclosure does not limit specific the multi-segment ICP etching or etching gas, and the multi-segment ICP etching or etching gas is determined according to circumstances.

Figure 4D:
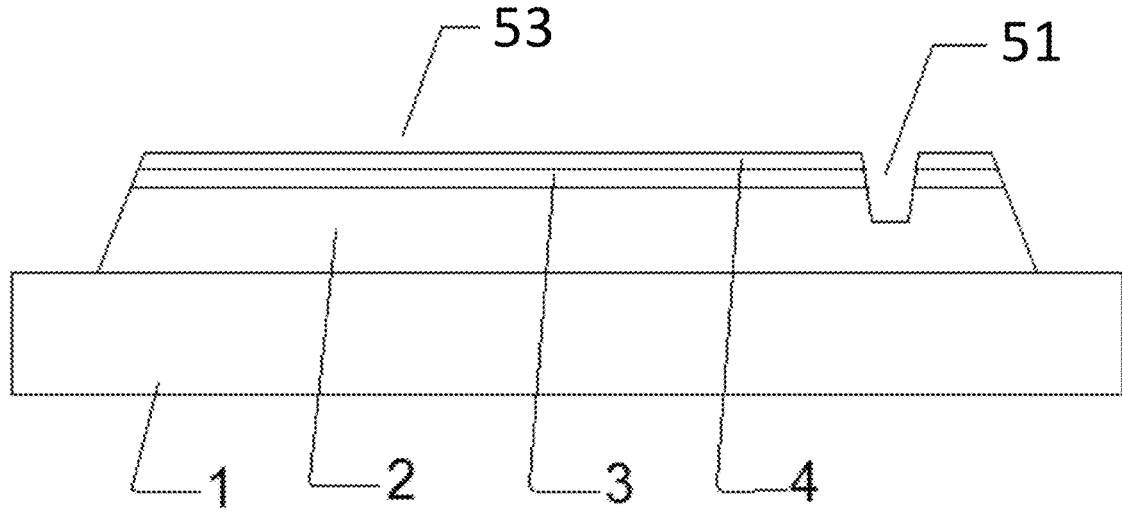
FIG. 4D is an example diagram of structures including the epitaxial laminated layer corresponding to the single LED array unit provided in a fourth step of the method in accordance with one or more examples of the present disclosure.

In Step 504, the manufacturer forms one or more epitaxial laminated layers arranged at intervals by deeply etching the epitaxial laminated layer to expose the surface of the substrate 1. Structures including the epitaxial laminated layer corresponding to a single LED array unit provided in Step 504 are illustrated in FIG. 4D.

In some examples, forming one or more epitaxial laminated layers arranged at intervals by deeply etching the epitaxial laminated layer to expose the surface of the substrate 1 includes: using multi-segment ICP etching, where an etching gas includes at least one of $Cl_2$, Ar, or $O_2$. This disclosure does not limit specific the multi-segment ICP etching or etching gas, and the multi-segment ICP etching or etching gas is determined according to circumstances.

Figure 4E:
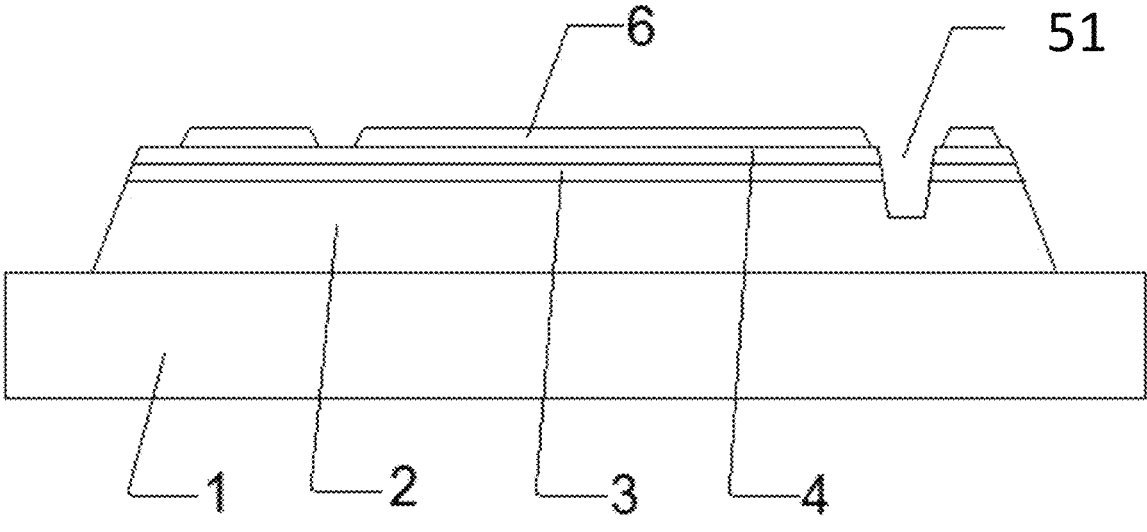
FIG. 4E is an example diagram of structures including a transparent conductive layer on one or more mesas of one or more epitaxial laminated layers corresponding to the single LED array unit provided in a fifth step of the method in accordance with one or more examples of the present disclosure.

In Step 505, the manufacturer deposits a transparent conductive layer 6 on the one or more mesas 53 of the one or more epitaxial laminated layers. Structures including the transparent conductive layer 6 on the one or more mesas 53 of the one or more epitaxial laminated layers provided in Step 505 are illustrated in FIG. 4E.

In some examples, a material of the transparent conductive layer 6 may be Indium Tin Oxide (ITO), and a formation process of the transparent conductive layer 6 may be electron beam evaporation, sputtering deposition, or other similar processes. Specific material of the transparent conductive layer 6 and specific formation process of the transparent conductive layer 6 are determined according to circumstances, and are not limited in this disclosure.

Figure 4F:
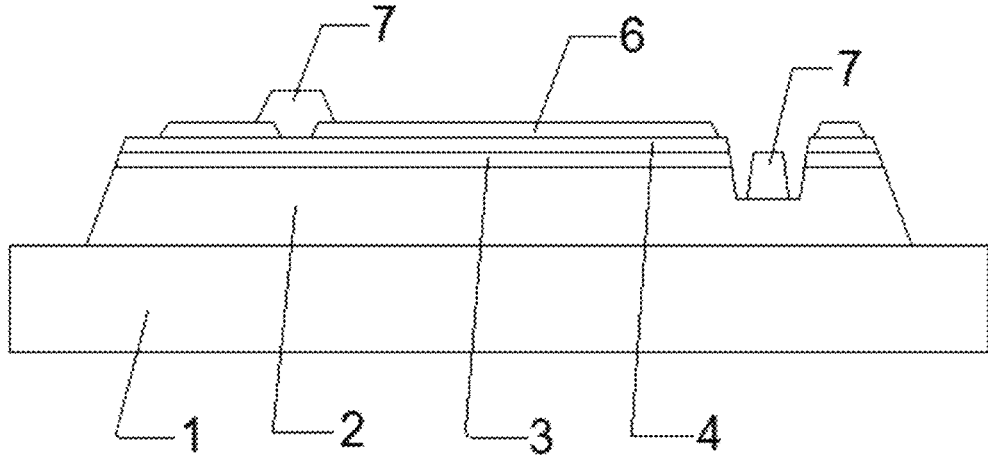
FIG. 4F is an example diagram of structures including an electrode extension bar on a surface of the transparent conductive layer corresponding to the single LED array unit provided in a sixth step of the method in accordance with one or more examples of the present disclosure.

In Step 506, the manufacturer forms an electrode extension bar 7 on a surface of the transparent conductive layer 6. Structures including the electrode extension bar 7 on the surface of the transparent conductive layer 6 provided in Step 506 are illustrated in FIG. 4F.

In some examples, the electrode extension bar 7 may include an electrode extension bar 7 formed or disposed on the one or more mesas 53 and/or an electrode extension bar 7 formed or disposed in the one or more grooves 51. The electrode extension bar 7 disposed on the one or more mesas 53 may function as an extension of the second electrode 10 on the one or more mesas 53; the electrode extension bar 7 disposed in the one or more grooves 51 may function as an extension of the first electrode 9 on the one or more grooves 51. A quantity of the electrode extension bar 7 may be one or multiple. A formation process of the electrode extension bar 7 may be electron beam evaporation Specific quantity of the electrode extension bar 7 and specific formation process of the electrode extension bar 7 are determined according to circumstances, and are not limited in this disclosure.

In some examples, the electrode extension bar 7 disposed on the one or more mesas 53 may be directly electrically connected to the second type semiconductor layer 4 through a through hole, where the through hole exposes part of a surface of the electrode extension bar 7. This enables the electrode extension bar 7 to directly electrically connect with the second type semiconductor layer 4. Thereby, in the LED array units, a current of an electrode 10 flows directly into the epitaxial laminated layer, which is beneficial for practical operation. In other examples of this disclosure, the electrode extension bar 7 may also be stacked on a surface of a transparent conductive layer 6, depending on specific circumstances, without limitation imposed by this disclosure.

In some examples, the electrode extension bar 7 includes at least one of Cr, Ni, Al, Ti, Pt, or Au, or any combination thereof. Specific composition of the electrode extension bar 7 is determined according to circumstances, and is not limited in this disclosure.

Figure 4G:
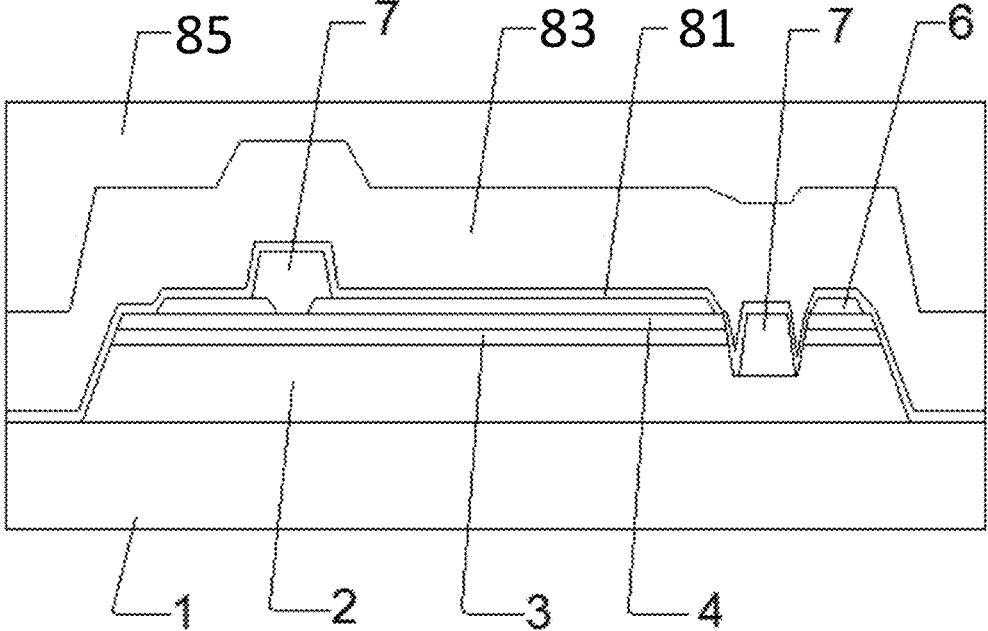
FIG. 4G is an example diagram of structures including a DBR structure layer corresponding to the single LED array unit provided in a seventh step of the method in accordance with one or more examples of the present disclosure.

In Step 507, the manufacturer forms a Distributed Bragg Reflector (DBR) structure layer on a surface of the epitaxial stack layer, the DBR structure layer including a DBR adhesive layer 81, a DBR reflective layer 83, and a DBR sacrificial layer 85, wherein the DBR adhesive layer 81, the DBR reflective layer 83, and the DBR sacrificial layer 85 are sequentially stacked. Structures including the DBR structure layer provided in Step 507 are illustrated in FIG. 4G.

In some examples, the DBR adhesive layer 81 is obtained in Step 507 by atomic layer deposition, and includes at least one of $Ti_3O_5$, $SiO_2$, or $Al_2O_3$, or any combination thereof. Specific manufacturing process of the DBR adhesive layer 81 and for example materials of the DBR adhesive layer 81 are determined according to circumstances, and are not limited in this disclosure.

In some examples, the DBR reflective layer 83 includes a plurality of film layers with alternating high and low refractive rate, where thickness of each film layer is one-fourth of a wavelength of light emitted by the micro light-emitting element.

In some examples, the DBR sacrificial layer 85 includes a spin-coated glass layer or an insulating film obtained by low-temperature deposition. Specific manufacturing process of the spin-coated glass layer or the insulating film is determined according to circumstances, and is not limited in this disclosure.

In some examples, etching rates of the DBR sacrificial layer 85, the DBR reflective layer 83, and the DBR adhesive layer 81 are sequentially decreased.

Figure 4H:
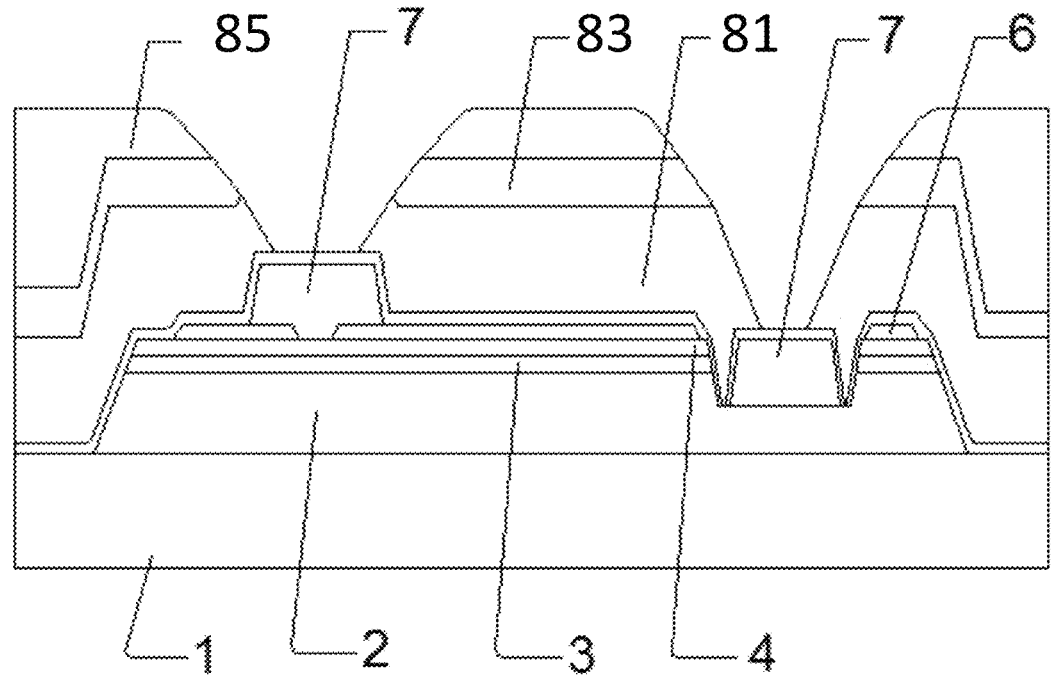
FIG. 4H is an example diagram of structures including the DBR structure layer which includes a first through hole and a second through hole corresponding to the single LED array unit provided in an eighth step of the method in accordance with one or more examples of the present disclosure.

In Step 508, the manufacturer configures, through an etching process, the DBR structure layer to include a first through hole exposing part of surfaces of the one or more grooves 51 and a second through hole exposing part of a surface of the electrode extension bar 7. Structures including the DBR structure layer which includes the first through hole and the second through hole provided in Step 508 are illustrated in FIG. 4H.

In some examples, alignment for etching can be specifically achieved by spin-coating photoresist onto the surfaces of the one or more grooves 51 or the surface of the electrode extension bar 7.

In some examples, density of film layers of the DBR sacrificial layer 85, the DBR reflective layer 83, and the DBR adhesive layer 81 are sequentially increased, so that etching rates of the DBR sacrificial layer 85, the DBR reflective layer 83, and the DBR adhesive layer 81 are sequentially decreased during etching, thereby forming an inverted trapezoidal through hole which includes an inclined side wall through the etching process. In some examples, forming the inverted trapezoidal through hole which includes the inclined side wall in Step 508 includes: using a photoresist as a mask layer, exposing an opening region through a photoetching development process; etching the DBR sacrificial layer 85 corresponding to the opening region by means of an etching solution to form a lateral etching interface; and using multi-segment Inductively Coupled Plasma (ICP) etching to completely etch a protrusion of the DBR structure layer formed by the electrode extension bar, thereby forming a DBR structure layer comprising a smooth cross-section.

In some examples, an included angle is formed in Step 508 between the inclined side wall and a horizontal surface of the epitaxial laminated layer, and a value θ of the included angle is in a range of 5°-50°, inclusive of endpoint values.

In some examples, in Step 508, a ratio of a thickness of the DBR reflective layer 83 to a thickness of the DBR sacrificial layer 85 is in a range of 1:1 to 1:5; and the thickness of the DBR sacrificial layer 85 increases as the included angle decreases. This disclosure does not limit specific values of thickness of the DBR reflective layer 83 and thickness of the DBR sacrificial layer 85, as long as the ratio of the thickness of the DBR reflective layer 83 to the thickness of the DBR sacrificial layer 85 satisfies the requirements above and a relation of the thickness of the DBR sacrificial layer 85 and the included angle satisfies the requirements above. Specific thickness values are determined according to circumstances.

In some examples, in Step 508, the multi-segment ICP etching adopts $CH_xF_y$ gas as an etching process gas, and $O_2$ or Ar as an auxiliary gas, where the sum of x and y is 4.

In some examples, during a process of the multi-segment ICP etching in Step 508, a ratio of the etching process gas to the auxiliary gas varies in a gradient manner.

In some examples, during the process of the multi-segment ICP etching in Step 508, the ratio of etching process gas to the auxiliary gas transitions from increasing in a gradient manner to decreasing in a gradient manner.

In some examples, during the process of the multi-segment ICP etching in Step 508, the ratio of etching process gas to the auxiliary gas gradually decreases from 1:6 to 1:4 to 1:2, and then the ratio of etching process gas to the auxiliary gas gradually increases from 1:2 to 1:4 to 1:6.

In some examples, in Step 508, the multi-segment ICP etching adopts $CHF_3$ gas as the etching process gas, and $O_2$ as the auxiliary gas.

Figure 4I:
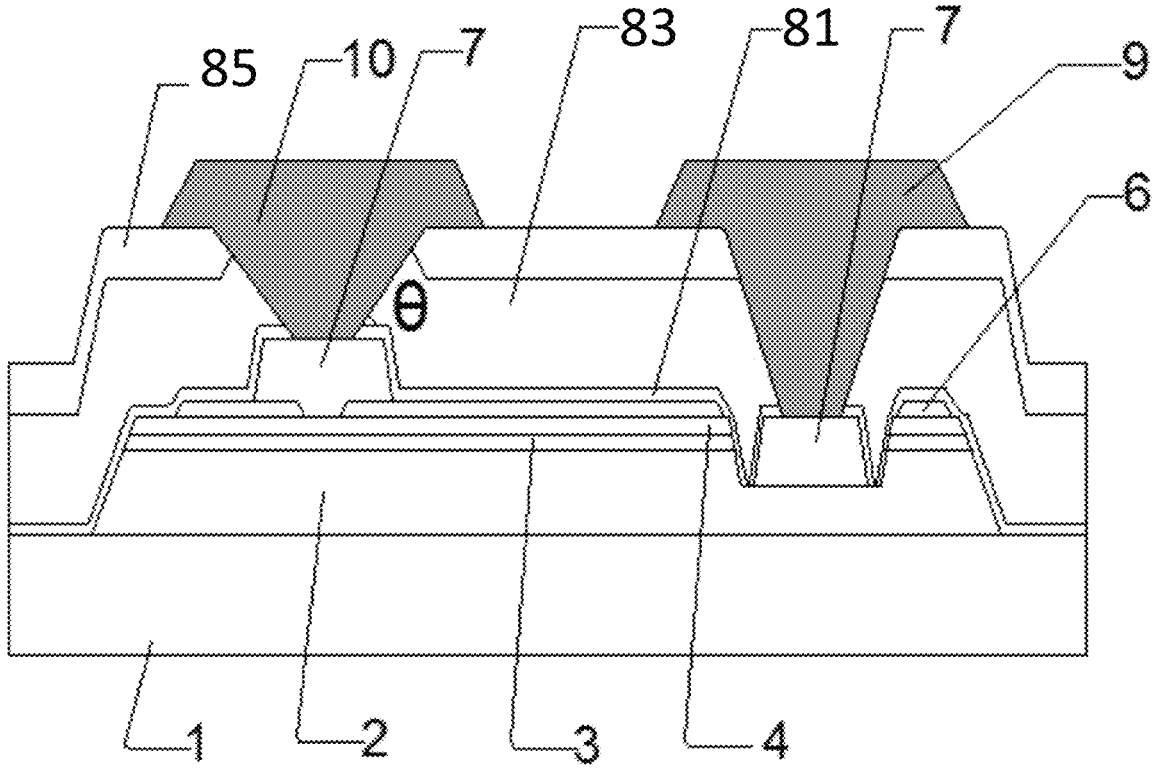
FIG. 4I is an example diagram of structures including a first electrode and a second electrode corresponding to the single LED array unit provided in a ninth step of the method in accordance with one or more examples of the present disclosure.

In Step 509, the manufacturer forms a first electrode 9 electrically connected with the first type semiconductor layer 2 in the first through hole, where the first through hole exposes the part of the surfaces of the one or more grooves 51; and forms a second electrode 10 electrically connected with the second type semiconductor layer 4 in the second through hole, where the second through hole exposes the part of the surface of the electrode extension bar 7. Structures including the first electrode 9 and the second electrode 10 provided in Step 509 are illustrated in FIG. 4I.

In some examples, the first electrode 9 and/or the second electrode 10 include at least one of Cr, Ni, Al, Ti, Pt, or Au, or any combination thereof. Specific composition of the first electrode 9 and/or the second electrode 10 is determined according to circumstances, and is not limited in this disclosure.

A third aspect of this disclosure provides a light-emitting device. The light-emitting device includes: a driving device, configured to transmit a driving signal to one or more micro light-emitting elements; and the one or more micro light-emitting elements.

Each of the one or more micro-lighting elements includes: a substrate and one or more light-emitting diode (LED) array units arranged on a surface of the substrate and isolated from each other by grooves.

The one or more LED array units include: an epitaxial laminated layer, including a first type semiconductor layer, an active layer, and a second type semiconductor layer. The first type semiconductor layer, the active layer, and the second type semiconductor layer are sequentially stacked in a first direction. A local area of the epitaxial laminated layer is etched to a part of the first type semiconductor layer resulting in a groove and a mesa. The first direction is perpendicular to the substrate, and points from the substrate to the epitaxial laminated layer.

The one or more LED array units may further include: an electrode extension bar stacked on the mesa; a Distributed Bragg Reflector (DBR) structure layer, including a DBR adhesive layer, a DBR reflective layer, and a DBR sacrificial layer, where the DBR adhesive layer, the DBR reflective layer, and the DBR sacrificial layer are sequentially stacked along a surface of the epitaxial laminated layer; where the DBR structure layer further includes a first through hole exposing part of a surface of the groove and a second through hole exposing part of a surface of the electrode extension bar; a first electrode stacked on the first through hole and electrically connected to the first type semiconductor layer; and a second electrode stacked on the second through hole and electrically connected to the second type semiconductor layer.

In some examples according to the third aspect, density of film layers of the DBR sacrificial layer, the DBR reflective layer, and the DBR adhesive layer are sequentially increased, so that etching rates of the DBR sacrificial layer, the DBR reflective layer, and the DBR adhesive layer are sequentially decreased during etching, thereby forming an inverted trapezoidal through hole which comprises an inclined side wall by an etching process.

In some examples according to the third aspect, an included angle is formed between the inclined side wall and a horizontal surface of the epitaxial laminated layer, and a value of the included angle is in a range of 5°-50°, inclusive of endpoint values.

In some examples according to the third aspect, a ratio of a thickness of the DBR reflective layer to a thickness of the DBR sacrificial layer is in a range of 1:1 to 1:5; and the thickness of the DBR sacrificial layer increases as the included angle decreases.

In some examples according to the third aspect, the mesa further includes a transparent conductive layer, and the electrode extension bar is stacked on a side surface of the transparent conductive layer facing away from the epitaxial stack layer.

In some examples according to the third aspect, the DBR adhesive layer is obtained by atomic layer deposition, and comprises at least one of $Ti_3O_5$, $SiO_2$, or $Al_2O_3$, or any combination thereof. Specific manufacturing process of the DBR adhesive layer and for example materials of the DBR adhesive layer are determined according to circumstances, and are not limited in this disclosure.

In some examples according to the third aspect, the DBR sacrificial layer includes a spin-coated glass layer or an insulating film obtained by low-temperature deposition. Specific manufacturing process of the spin-coated glass layer or the insulating film is determined according to circumstances, and is not limited in this disclosure.

FIG. 3 illustrates a micro light-emitting element as an example of the one or more micro light-emitting elements in accordance with the third aspect of this disclosure. Detailed description of FIG. 3, including numbering of components or structures in FIG. 3, has been presented above in this disclosure.

In some examples, the one or more grooves 51 formed in Step 503 of the method of the second aspect correspond to the groove 51 in the third aspect of the disclosure. In some examples, the groove 51 in the third aspect of the disclosure corresponds to the one or more grooves 51 formed in Step 503 of the method of the second aspect.

In some examples, the one or more mesas 53 formed in Step 503 of the method of the second aspect correspond to the mesa 53 in the third aspect of the disclosure. In some examples, the mesa 53 in the third aspect of the disclosure corresponds to the one or more mesas 53 formed in Step 503 of the method of the second aspect.

Based on the technical solutions above, this disclosure provides a micro light-emitting element which includes a DBR structure layer, including a DBR adhesive layer 81, a DBR reflective layer 83, and a DBR sacrificial layer 85 where the DBR adhesive layer 81, the DBR reflective layer 83, and the DBR sacrificial layer 85 are sequentially stacked along the surface of the epitaxial laminated layer. The structural coverage of DBR reflective layer 83 is subsequently improved by the DBR adhesive layer 81. In addition, by way of disposing the DBR sacrificial layer 85 on the DBR reflective layer 83, a lateral etching interface can be formed when using etching solution to etch the DBR sacrificial layer 85 corresponding to an opening, avoiding over-etching damage to the DBR reflective layer 83. Furthermore, density of film layers of the DBR sacrificial layer 85, the DBR reflective layer 83, and the DBR adhesive layer 81 are sequentially increased, so that etching rates of the DBR sacrificial layer 85, the DBR reflective layer 83, and the DBR adhesive layer 81 are sequentially decreased during etching, thereby forming an inverted trapezoidal through hole which includes an inclined side wall through the etching process; as such, a height difference between the DBR reflective layer 83 above the electrode extension bar 7 and the DBR reflective layer 83 above the transparent conductive layer 6 or the ITO is eliminated, forming the one or more mesas 53 that are smooth. This ensures that the first electrode 9 and/or the second electrode 10 are essentially at a same height, enhancing their reliability against pull-out or push-out and avoiding electrode detachment risks. Additionally, the inclined side wall of inverted trapezoidal through benefits subsequent coverage of the first electrode 9, increases a contact area between the first electrode 9 and the DBR structure layer, and enables a good adhesion between the DBR structure layer and electrodes, thereby ensuring reliability of the light-emitting element.

An included angle is formed between the inclined side wall and a horizontal surface of the epitaxial laminated layer, and a value θ of the included angle is in a range of 5°-50°, inclusive of endpoint values, making the first through whole in which the first electrode 9 is deposed gentler, further and thoroughly eliminating the height difference between the DBR reflective layer 83 above the electrode extension bar 7 and the DBR reflective layer 83 above the transparent conductive layer 6 or the ITO caused by the presence of the electrode extension bar 7.

Furthermore, a ratio of a thickness of the DBR reflective layer 83 to a thickness of the DBR sacrificial layer 85 is in a range of 1:1 to 1:5; and the thickness of the DBR sacrificial layer 85 increases as the included angle decreases. While protecting the DBR reflective layer 83, this effectively eliminates the height difference between the DBR reflective layer 83 above the electrode extension bar 7 and the DBR reflective layer 83 above the transparent conductive layer 6 or the ITO caused by the presence of the electrode extension bar 7.

Additionally, the DBR adhesive layer 81 is obtained by atomic layer deposition, and includes at least one of $Ti_3O_5$, $SiO_2$, or $Al_2O_3$, or any combination thereof, which can achieve a highly dense and adhesive film layer.

This disclosure also provides a method for manufacturing a micro light-emitting element. While achieving beneficial effects of the micro light-emitting element in this disclosure, the method for manufacturing a micro light-emitting element in this disclosure is simple and convenient, facilitating mass production.

In some examples, forming an inverted trapezoidal through hole which includes an inclined side wall includes: using a photoresist as a mask layer, exposing an opening region through a photoetching development process; etching the DBR sacrificial layer 85 corresponding to the opening region by means of an etching solution to form a lateral etching interface; and using multi-segment Inductively Coupled Plasma (ICP) etching to completely etch a protrusion of the DBR structure layer 85 formed by the electrode extension bar, thereby forming a DBR structure layer 85 including a smooth cross-section. After forming the lateral etching interface via etching the DBR sacrificial layer 85, by way of using the ICP etching to configure an etching angle of the DBR structure layer to form a gradient slope, metal coverage of electrodes are improved.

This disclosure also provides a light-emitting device, including: a driving device, configured to transmit a driving signal to one or more micro light-emitting elements; and the one or more micro light-emitting elements, where each of the one or more micro-lighting elements may achieve beneficial effects of the micro light-emitting element provided in this disclosure.

Examples described in this disclosure are presented in a progressive manner, with each example emphasizing differences from other examples. Common or similar features between various examples may be cross-referenced accordingly.

Furthermore, in this disclosure, relational terms such as "first" or "second" are used to differentiate one entity or operation from another, and do not necessarily imply any actual relationship or sequence between these entities or operations. Additionally, terms such as "comprising," "including," or any other variations thereof, are intended to encompass non-exclusive inclusion, where items or devices including a series of elements include not only those elements explicitly listed but also other elements not explicitly stated or inherently included in such items or devices. In situations without further limitations, the use of the phrase "comprising a . . . " to define an element does not exclude the existence of additional identical elements within items or devices that include the aforementioned element.

The description or illustration of examples in the disclosure enables those skilled in the art to implement or utilize the present disclosure. Various modifications to these examples will be apparent to those skilled in the art, and principles defined here can be implemented in other examples without departing from the scope of this disclosure. Accordingly, this disclosure is not limited to the examples illustrated, but is intended to encompass the widest scope consistent with the principles and features disclosed here.

What is claimed is:

1. A micro light-emitting element, comprising: a substrate and one or more light-emitting diode (LED) array units arranged on a surface of the substrate and isolated from each other by grooves, wherein the one or more LED array units comprise:
   an epitaxial laminated layer, comprising a first type semiconductor layer, an active layer, and a second type semiconductor layer, wherein:
   the first type semiconductor layer, the active layer, and the second type semiconductor layer are sequentially stacked in a first direction;
   a local area of the epitaxial laminated layer is etched to a part of the first type semiconductor layer, resulting in a groove and a mesa; and
   the first direction is perpendicular to the substrate, and points from the substrate to the epitaxial laminated layer;
   an electrode extension bar stacked on the mesa;
   a Distributed Bragg Reflector (DBR) structure layer, comprising a DBR adhesive layer, a DBR reflective layer, and a DBR sacrificial layer, wherein the DBR adhesive layer, the DBR reflective layer, and the DBR sacrificial layer are sequentially stacked along a surface of the epitaxial laminated layer; wherein the DBR structure layer further comprises a first through hole exposing part of a surface of the groove and a second through hole exposing part of a surface of the electrode extension bar;

a first electrode stacked on the first through hole and electrically connected to the first type semiconductor layer; and a second electrode stacked on the second through hole and electrically connected to the second type semiconductor layer.

2. The micro light-emitting element according to claim 1, wherein density of film layers of the DBR sacrificial layer, the DBR reflective layer, and the DBR adhesive layer are sequentially increased, so that etching rates of the DBR sacrificial layer, the DBR reflective layer, and the DBR adhesive layer are sequentially decreased during etching, whereby an inverted trapezoidal through hole is etched, the inverted trapezoidal through hole comprising an inclined side wall.

3. The micro light-emitting element according to claim 2, wherein an included angle is between the inclined side wall and a horizontal surface of the epitaxial laminated layer, and wherein a value of the included angle is in a range of 5°-50°, inclusive of endpoint values.

4. The micro light-emitting element according to claim 3, wherein a ratio of a thickness of the DBR reflective layer to a thickness of the DBR sacrificial layer is in a range of 1:1 to 1:5; and wherein the thickness of the DBR sacrificial layer increases as the included angle decreases.

5. The micro light-emitting element according to claim 1, wherein the mesa further comprises a transparent conductive layer, and the electrode extension bar is stacked on a side surface of the transparent conductive layer facing away from the epitaxial stack layer.

6. The micro light-emitting element according to claim 1, wherein the DBR adhesive layer comprises at least one of $Ti_3O_5$, $SiO_2$, or $Al_2O_3$, and the DBR adhesive layer is deposited through atomic layer deposition.

7. The micro light-emitting element according to claim 1, wherein the DBR sacrificial layer comprises a spin-coated glass layer or an insulating film deposited through low-temperature deposition.

8. A light-emitting device, comprising:

a driving device, configured to transmit a driving signal to one or more micro light-emitting elements; and the one or more micro light-emitting elements, wherein each of the one or more micro-lighting elements comprises:

a substrate and one or more light-emitting diode (LED) array units arranged on a surface of the substrate and isolated from each other by grooves, wherein the plurality of LED array units comprise:

an epitaxial laminated layer, comprising a first type semiconductor layer, an active layer, and a second type semiconductor layer wherein:

the first type semiconductor layer, the active layer, and the second type semiconductor layer are sequentially stacked in a first direction;

a local area of the epitaxial laminated layer is etched to a part of the first type semiconductor layer, resulting in a groove and a mesa; and the first direction is perpendicular to the substrate, and points from the substrate to the epitaxial laminated layer;

an electrode extension bar stacked on the mesa;

a Distributed Bragg Reflector (DBR) structure layer, comprising a DBR adhesive layer, a DBR reflective layer, and a DBR sacrificial layer, wherein the DBR adhesive layer, the DBR reflective layer, and the DBR sacrificial layer are sequentially stacked along a surface of the epitaxial laminated layer; wherein the DBR structure layer further comprises a first through hole exposing part of a surface of the groove and a second through hole exposing part of a surface of the electrode extension bar;

a first electrode stacked on the first through hole and electrically connected to the first type semiconductor layer; and a second electrode stacked on the second through hole and electrically connected to the second type semiconductor layer.

9. The light-emitting device according to claim 8, wherein density of film layers of the DBR sacrificial layer, the DBR reflective layer, and the DBR adhesive layer are sequentially increased, so that etching rates of the DBR sacrificial layer, the DBR reflective layer, and the DBR adhesive layer are sequentially decreased during etching, whereby an inverted trapezoidal through hole is etched, the inverted trapezoidal through hole comprising an inclined side wall.

10. The light-emitting device according to claim 9, wherein an included angle is between the inclined side wall and a horizontal surface of the epitaxial laminated layer, and wherein a value of the included angle is in a range of 5°-50°, inclusive of endpoint values.

11. The light-emitting device according to claim 10, wherein a ratio of a thickness of the DBR reflective layer to a thickness of the DBR sacrificial layer is in a range of 1:1 to 1:5; and wherein the thickness of the DBR sacrificial layer increases as the included angle decreases.

12. The light-emitting device according to claim 8, wherein the mesa further comprises a transparent conductive layer, and the electrode extension bar is stacked on a side surface of the transparent conductive layer facing away from the epitaxial stack layer.

13. The light-emitting device according to claim 8, wherein the DBR adhesive layer comprises at least one of $Ti_3O_5$, $SiO_2$, or $Al_2O_3$, and the DBR adhesive layer is deposited through atomic layer deposition.

14. The light-emitting device according to claim 8, wherein the DBR sacrificial layer comprises a spin-coated glass layer or an insulating film deposited through low-temperature deposition.

* * * * *